(12) United States Patent  
Wang et al.

(10) Patent No.: US 8,743,592 B2  
(45) Date of Patent: Jun. 3, 2014

(54) MEMORY CIRCUIT PROPERLY WORKABLE UNDER LOW WORKING VOLTAGE

(75) Inventors: Jinn-Shyan Wang, Chiayi (TW); Pei-Yao Chang, Yunlin County (TW)

(73) Assignee: National Chung Cheng University, Chia-Yi (TW)

( * ) Notice: Subject to any disclaimer, the term of this patent is extended or adjusted under 35 U.S.C. 154(b) by 234 days.

(21) Appl. No.: 13/477,437

(22) Filed: May 22, 2012

(65) Prior Publication Data

US 2013/0314977 A1    Nov. 28, 2013

(51) Int. Cl.
*G11C 11/412*    (2006.01)

(52) U.S. Cl.
USPC .......................................... 365/154; 365/156

(58) Field of Classification Search
CPC ................ G11C 11/41; G11C 11/412–11/413; G11C 11/417–11/419
USPC .................................. 365/154, 156
See application file for complete search history.

(56) References Cited

U.S. PATENT DOCUMENTS

| | | | | |
|---|---|---|---|---|
| 7,283,410 B2 * | 10/2007 | Hsu et al. | ...................... | 365/201 |
| 7,515,491 B2 * | 4/2009 | Joshi et al. | ..................... | 365/201 |
| 7,826,253 B2 * | 11/2010 | Takeda | .......................... | 365/156 |
| 7,872,927 B2 * | 1/2011 | Takeda | ..................... | 365/189.16 |
| 8,369,134 B2 * | 2/2013 | Singh et al. | .................... | 365/154 |
| 2008/0019162 A1 * | 1/2008 | Ogura et al. | .................... | 365/72 |

OTHER PUBLICATIONS

Koichi Takeda et al., "A Read-Static-Noise-Margin-Free SRAM Cell for Low-VDD and High-Speed Applications", IEEE Journal of Solid-State Circuits, Vol. 41, No. 1, January 2006, pp. 113-121.
Leland Chang et al., "Stable SRAM Cell Design for the 32 nm Node and Beyond", 2005 Symposium on VLSI Technology Digest of Technical Papers, 2005, pp. 128-129.
Benton H. Calhoun et al., "256kb Sub-threshold SRAM in 65nm CMOS", 2006 IEEE International Solid-State Circuits Conference, ISSCC 2006 / Session 34 / SRAM / 34.4, 10 pages.
Bo Zhai, David Blaauw et al., "Sub-200mV 6T SRAM in 0.13pm CMOS", 2007 IEEE International Solid-State Circuits Conference , ISSCC 2007 1 Session 18/ SRAMVI/ 186, 3 pages.
K. Zhang et al., "A 3-GHz 70Mb SRAM in 65nm CMOS Technology with Integrated Column-Based Dynamic Power Supply", 2005 IEEE International Solid-State Circuits Conference, ISSCC 2005 / Session 26 / Non-Volatile Memory / 26.1, 3 pages.

(Continued)

*Primary Examiner* — Harry W Byrne
*Assistant Examiner* — Lance Reidlinger
(74) *Attorney, Agent, or Firm* — Muncy, Geissler, Ols & Lowe, P.C.

(57) ABSTRACT

A memory circuit properly workable under low working voltage includes a plurality of write word lines, a plurality of write bit lines, a plurality of read/write word lines, a plurality of read/write bit lines, a plurality of read/write inverted word lines, a plurality of virtual voltage source circuits, a plurality of virtual ground circuits, and a plurality of asymmetrical RAM cells constituting a cell array. The asymmetrical RAM cells are formed of seven transistors, five of which are NMOS transistors and two of which are PMOS transistors. The virtual voltage power source circuit and the virtual ground circuit can reinforce the write-in and read abilities under low working voltage to make the write-in and read actions more stable, decrease leakage current, and lower power consumption.

3 Claims, 13 Drawing Sheets

(56) References Cited

OTHER PUBLICATIONS

Masanao Yamaoka et al., "A 300MHz 25 μA/Mb Leakage On-Chip SRAM Module Featuring Process-Variation Immunity and Low-Leakage-Active Mode for Mobile-Phone Application Processor" 2004 IEEE International Solid-State Circuits Conference, ISSCC 2004 / Session 27 / SRAM / 27.2, 10 pages.

Naveen Verma et al. "A 65nm 8T Sub-Vt SRAM Employing Sense-Amplifier Redundancy", 2007 IEEE International Solid-State Circuits Conference, ISSCC 2007 / Session 18 / SRAM / 18.4, 3 pages.

* cited by examiner

MEMORY CIRCUIT PROPERLY WORKABLE UNDER LOW WORKING VOLTAGE

BACKGROUND OF THE INVENTION

1. Field of the Invention

The present invention relates generally to the architecture of memory cells in the integrated circuit (IC), and more particularly, to a memory circuit properly workable under low working voltage.

2. Description of the Related Art

The area and power of the static random access memory (SRAM) are key challenges for very large scale IC or system on chip; if the area is smaller, the cost of the chip can be reduced more effectively and the reliability of the memory circuit can be enhanced. Besides, the low-voltage operation has become one of the trends of the current low-power IC design, so the design of SRAM also needs to be developed toward low voltage and should take noise immunocompetence into account.

Among the rough classifications of SRAM cells, the conventional six-transistor (6T) cell is the most typical example. Thereafter, the SRAM cell was developed to be 7T cell, 8T cell, and 10T cell to properly work under low working voltage. The greatest advantage of the conventional 6T cell lies in its smallest area and lowest cost, compared with the 6T, 7T, and 8T cells, but the noise immunocompetence of the 6T cell is much worse than those of the 6T, 7T, and 8T cells.

FIG. 5 illustrates the conventional 6T cell structure. FIG. 6 illustrates the bit line architecture of the 6T cell. When read proceeds, the node n2 results in little rise of voltage level, because of voltage division, to lower static noise margin (SNM), so the saved value is subject to influence of external noises. When the noises exceed the SNM, the saved value will be damaged. Such circumstance will become worse while the operation proceeds under low voltage.

The design of the memory further needs to consider leakage current. When read proceeds, the logic of the word line WL is 1 and the bit line BL is connected with many memory inactive cells to be subject to the influence of the leakage current I_leak generated by the transistors 116 and 126. Besides, the whole leakage current may be great enough to lower the voltage level of the bit line BL down to 0 to further result in incorrect reading.

FIG. 7 illustrates a 7T-cell architecture proposed by Takeda, K., Hagihara, Y., Aimoto, Y., Nomura, M., Nakazawa, Y., Ishii, T., and Kobatake, H. on *SOLID-STATE CIRCUITS, 2005 IEEE International Conference Digest of Technical Papers*, in 2005 and disclosed in a dissertation titled "A read-static-noise-margin-free ASRAM cell for low-VDD and high-speed applications". Compared with the 6T-cell architecture, the 7T-cell architecture includes one more transistor; its control line is composed of a write word line WWL, a read/write line WL, and a read/write inverted word line WLn and its data line is composed of a read/write bit line BL and a write bit line WBL.

The aforesaid 7T-cell architecture actually fails to work under too low voltage. When accumulation of leakage current or noise interference happens, the potential of the node q2 may rise. If the potential of the node q2 rises due to the leakage current of the PMOS (p-type metal oxide semiconductor) transistor 201, as the read time is longer, the rising potential of the node q2 will be higher. When the rising of the potential of the node q2 is too high, the potential of the nodes of the memory cells becomes inverted to change the node q2 from its logic "1" to "0" and change the node q1 from its logic "0" to "1" to further result in data error. Such phenomenon is called destructive read. When the working voltage is too low, the voltage tolerance becomes lower, so such phenomenon becomes more and more serious.

In addition, when the aforesaid 7T cells is writing, if the write noise margin is insufficient, write failure may happen. This problem becomes more serious as the working voltage is lower.

FIG. 8 illustrates that a bit-line architecture constituted based on 7T cells, which is still vulnerable to leakage current to result in read error. Similarly, when the working voltage is lower, this problem becomes more serious.

To enable the memory cells to work under lower working voltage stably and reliably, someone developed a more complicated architecture. FIG. 9 shows an 8T-cell architecture proposed by L. Chang, D. M. Fried, J. Hergenrother, J. W. Sleight, R. H. Dennard, R. K. Montoye, L. Sekaric, S. J. McNab, A. W. Topol, C. D. Adams, K. W. Guarini, and W. Haensch at pages 128-129 of in *Symp. VLSI Technology Dig. Tech. Papers* in 2005 and disclosed in a dissertation titled "Stable SRAM Cell Design for the 32 nm Node and Beyond". The emphases of this design lie in that read and write ends are separated and two additional NMOS (n-type metal oxide semiconductor) transistors function as an independent read end to avoid the aforesaid destructive read. FIG. 10 shows a 10T-cell architecture proposed by Calhoun, B. H.; Chandrakasan, A. at pages 2592-2601 of *SOLID-STATE CIRCUITS, 2006 IEEE International Conference Digest of Technical Papers* in 2006 and disclosed in an dissertation titled "A 256 kb Sub-threshold SRAM in 65 nm CMOS". The emphases of this design lie in that read and write ends are also separated and to prevent the data line from suffering the leakage current under low voltage, the independent read end can further effectively control the leakage current of the cells toward the data line by means of a PMOS and three NMOS transistors. FIG. 11 shows a single-end six-transistor (S6T) memory cell architecture composed of a transmission gating 330 and a 4T latch formed of two inverters 331 and 332 as proposed by Bo Zhai; Blaauw, D., Sylvester, D., and Hanson, S. at pages 332-334 of *SOLID-STATE CIRCUITS, 2007 IEEE International Conference Digest of Technical Papers* in 2007 and disclosed in a dissertation titled "A Sub-200 mV 6T SRAM in 0.13 um CMOS". The emphasis of this design is to prevent the conventional 6T cells from interference with two data lines in the process of read to further prevent the read noise immunocompetence of the cells from attenuation, making the single-end transmission gating be the read end for correctly transmitting cell storage voltage to the bit line. However, such design needs correct size of transistor to do the expected action.

Besides, one of the tendencies of the memory design is to reduce power consumption for controlling the way of power supply by means of power gating and for controlling current flowing back to the ground wire by means of ground gating. Recently, some improved designs of power gating and ground gating coordinated with the method of changing memory cells to more effectively save the power consumption or to make the circuit work more stably under low working voltage.

FIG. 12 shows a structure of the conventional 6T cell array to which power granting is applied as proposed by K. Zhang et al. at pages 474-475 of in *IEEE Int. Solid-State Circuits Conf (ISSCC) Dig. Tech. Papers* in 2005 and disclosed in a dissertation titled "A 3-GHz70 Mb SRAM in 65 nm CMOS technology with integrated column-based dynamic power supply". In this structure, a big memory cell array is partitioned into many small memory cell banks. Each of the small memory cell banks includes two voltage sources, one of which is high-potential voltage source VDDH and the other is low-potential voltage source VDDL. Which of the voltage sources supplies voltage for the small memory cell banks is decided by PMOS power switch. Taking the power switches 410 and 411 as an example, in the time frame that the small memory cell banks are not working, activate the power switch 410 to deactivate the power switch 411 to connect the small memory cell banks to the power source VDDL for the purpose of lowering the power consumption of cell leakage current; in the time frame that the small memory cell banks are working, activate the power switch 411 to deactivate the power switch 410 to connect the small memory cell banks to the power source VDDH for the purpose of heightening power supply to accelerate the operation speed of the memory.

FIG. 13 shows a structure of the conventional 6T memory cell bank to which ground gating is applied as proposed by Yamaoka, M. and Shinozaki, Y. on *SOLID-STATE CIR-CUITS*, 2004 *IEEE International Conference Digest of Technical Papers* in 2004 and disclosed in a dissertation titled "A 300-MHz 25 μA/Mb leakage on-chip SRAM module featuring process-variation immunity and low-leakage-active mode for mobile-phone application processor". In this structure, a big memory cell array is likewise partitioned into many small memory cell banks. Each of the small memory cell banks is connected to a ground wire via an NMOS, a ground switch 421, an NMOS diode 422, and an NMOS resistor 423. An internal ground wire connected with the common drain of the ground switch 421, the NMOS diode 422, and the NMOS resistor 423 is defined as a virtual ground wire 42. In light of such structure, the consumption of leakage current of the cells can be reduced and the memory write-in ability can be strengthened.

FIG. 14 shows a structure of the memory cell bank to which a PMOS power switch is applied as derived from same literature indicated in FIG. 10. This structure is fully composed of 10T memory cells for the purpose of strengthening the rewrite and storage ability of the cells.

FIG. 15 shows a structure, in which a buffer functions as a read end of each array of the memory cell bank and each of the memory cell banks is composed of 8T memory cells, as proposed by Verna, N. and Chandrakasan, A. at pages 141-149, VOL. 43 of *IEEE J. of Solid-State Circuit* and disclosed in a dissertation titled "A 256 kb 65 nm 8T Subthreshold SRAM Employing Sense-Amplifier Redundance". This structure can avoid affecting the read speed of the memory and prevent the cells from causing interference of leakage current with the bit line.

FIG. 16 shows a structure, in which improved power gating and improved ground gating are applied to each of the memory cell arrays, as derived from same literature as in FIG. 11. The memory cells in each array is composed of S6T memory cells and provided with a virtual power cord and a virtual ground wire. This structure can avoid affecting the read speed of the memory and strengthen the memory write-in ability.

To sum up, how to lower working voltage as disclosed in each of the aforesaid literatures basically includes two designs, one of which is changing the structure of the cells, like 6T-cell, 7T-cell, 8T-cell or 10T-cell structure and the other is combining control of power line or ground wire with the 6T-cell, 7T-cell, 8T-cell or 10T-cell structure for working together. However, applying the new cell structure can bring forth considerable increase of area of the memory bank, e.g. changing 6T-cell structure to 8T-cell structure as indicated in FIG. 9 consumes additional 30-40% area at least; as indicated in FIG. 15, changing 6T-cell structure to S6T-cell structure consumes additional 100% area. So far, none of any people has proposed preferred structure to save the area of the cells and meanwhile effectively lower the working voltage.

SUMMARY OF THE INVENTION

The primary objective of the present invention is to provide a memory circuit, which can reinforce the write-in and read abilities under low working voltage to make the read/write action under low working voltage more stable.

The secondary objective of the present invention is to provide a memory circuit, which can decrease leakage current to further lower power consumption.

Another objective of the present invention is to provide a memory circuit, which can save cost consumption resulting from area of memory cells.

The foregoing objectives of the present invention are attained by the memory circuit, which is composed of a plurality of write word lines, a plurality of write bit lines, a plurality of read/write word lines, a plurality of read/write bit lines, a plurality of read/write inverted word lines, a plurality of virtual voltage source circuits, a plurality of virtual ground circuits, and a plurality of asymmetrical RAM cells constituting a cell array. The cell array is electrically connected with the write word lines, the write bit lines, the read/write word lines, the read/write bit lines, the read/write inverted word lines, the virtual voltage source circuits, and the virtual ground circuits. Each of the aforesaid asymmetric RAM cells is formed of seven transistors, five of which are NMOS transistors and two of which are PMOS transistors. Among the transistors, the gate of the first PMOS transistor is electrically connected with the drain of the second PMOS transistor, the drain of the second NMOS transistor, the gate of the third NMOS transistor, and the drain of the fourth NMOS transistor; the source of the first PMOS transistor is electrically connected with the virtual voltage source circuit; the drain of the first PMOS transistor is electrically connected with the gate of the second PMOS transistor, the gate of the fourth NMOS transistor, the drain of the first NMOS, and the drain of the fifth NMOS transistor; the source of the second PMOS transistor is electrically connected with an external voltage source; the gate of the first NMOS transistor is electrically connected with the write word line; the source of the first NMOS transistor is electrically connected with the write bit line; the gate of the second NMOS transistor is electrically connected with read/write word line, the source of the second NMOS transistor is electrically connected with the read/write bit lines; the source of the third NMOS transistor is electrically connected with the virtual ground circuit; the drain of the third NMOS transistor is electrically connected with the source of the fifth NMOS; the source of the fourth NMOS transistor is electrically connected with the virtual ground circuit; the gate of the fifth NMOS transistor is electrically connected with the read/write inverted word lines. In this way, the write and read abilities can be reinforced under the low working voltage to make the write and read actions more stable under the low working voltage. Besides, leakage current can be reduced to further lower power consumption. Thus, the reduction of leakage current and increasing the stability of write and read abilities can enable the write bit lines and the read/write bit lines to coordinate with more memory cells to further save the cost consumption resulting from the area of the memory cell array.

DETAILED DESCRIPTION OF PREFERRED EMBODIMENTS

Figure 1:
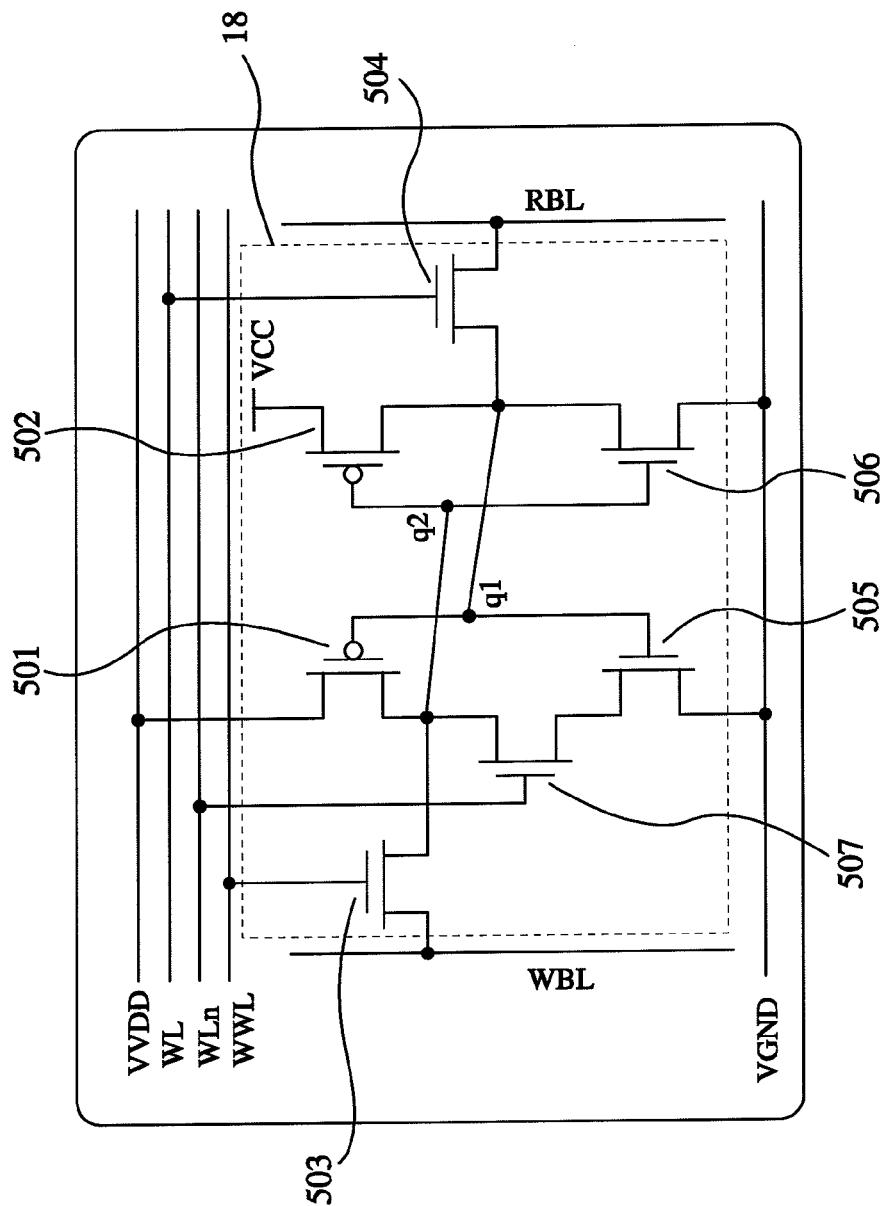
FIG. 1 is a circuit diagram of a part of a preferred embodiment of the present invention, illustrating the structure of an asymmetrical RAM cell.
Figure 2:
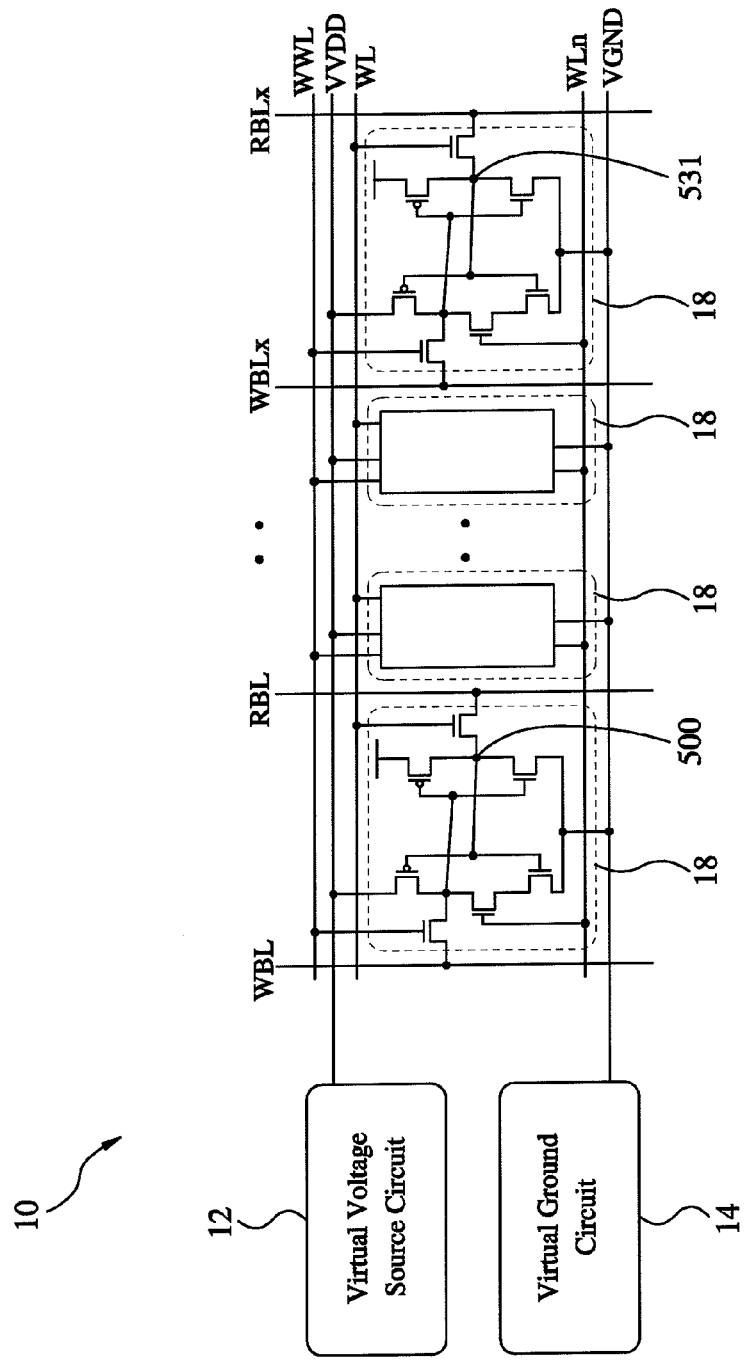
FIG. 2 is a circuit diagram of a part of the preferred embodiment of the present invention, illustrating that multiple asymmetrical RAM cells are constituted in an array.

Referring to FIGS. 1-4, a memory circuit 10 properly workable under low working voltage in accordance with a preferred embodiment of the present invention is composed of a plurality of write word lines WWL, a plurality of write bit lines WBL, a plurality of read/write word lines WL, a plurality of read/write bit lines RBL, a plurality of read/write inverted word lines WLn, a plurality of virtual voltage source circuits 12, a plurality of virtual ground circuits 14, and a plurality of asymmetrical RAM cells 18. The detailed descriptions and operations of these elements as well as their interrelations are recited in the respective paragraphs as follows.

The asymmetrical RAM cells 18 constitutes a cell array (not shown), which is connected with the write word lines WWL, the write bit lines WBL, the read/write word lines WL, the read/write bit lines RBL, the read/write inverted word lines WLn, the virtual voltage source circuits 12, and the virtual ground circuits 14. It is difficult to show an array composed of multiple asymmetrical RAM cells 18, so FIG. 2 only shows 32 asymmetrical RAM cells 18 constituted in a row, which one of the write word lines WWL, one of the write bit lines WBL, one of the read/write word lines WL, one of the read/write bit lines RBL, one of the read/write inverted word lines WLn, one of the virtual voltage source circuits 12, and one of the virtual ground circuits 14. Besides, FIG. 2 only shows the two (foremost and rearmost) asymmetrical RAM cells 18 and a spacing is presented between the foremost and rearmost asymmetrical RAM cells 18. The array formed of multiple rows of multiple asymmetrical RAM cells 18 belongs to the prior art, so detailed recitation is skipped.

Each of the aforesaid asymmetrical RAM cells 18 is formed of seven transistors, five of which are NMOS transistors and two of which are PMOS transistors, to constitute an a 7T memory cell.

The gate of the first PMOS transistor 501 is electrically connected with the drain of the second PMOS transistor 502, the drain of the second NMOS transistor 504, the gate of the third NMOS transistor 505, and the drain of the fourth NMOS 506. The source of the first PMOS 501 transistor is electrically connected with the virtual voltage source circuit 12. The drain of the first PMOS transistor 501 is electrically connected with the gate of the second PMOS transistor 502, the gate of the fourth NMOS transistor 506, the drain of the first NMOS transistor 503, and the drain of the fifth NMOS transistor 507.

The source of the second PMOS transistor 502 is electrically connected with an external voltage source VDD.

The gate of the first NMOS transistor 503 is electrically connected with the write word line WWL and the source of the first NMOS transistor 503 is electrically connected with the write bit line WBL.

The gate of the second NMOS transistor 504 is electrically connected with the read/write word lines WL and the source of the second NMOS transistor 504 is electrically connected with the read/write bit lines RBL.

The source of the third NMOS transistor 505 is electrically connected with the virtual ground circuit 14 and the drain of the third NMOS transistor 505 is electrically connected with the source of the fifth NMOS transistor 507.

The source of the fourth NMOS transistor 506 is electrically connected with the virtual ground circuits 14.

The gate of the fifth NMOS transistor 57 is electrically connected with the read/write inverted word lines WLn.

In this embodiment, each of the virtual voltage source circuits 12 includes a PMOS 121, a diode 122 formed of an NMOS, a diode 123 formed of a PMOS, and a virtual power cord VVDD. The PMOS 121, the diode 122, and the diode 123 are electrically connected with the virtual power cord VVDD. The virtual voltage source circuit 12 is electrically connected with the gate of the first PMOS transistor 501 via the virtual power cord VVDD. Each of the virtual ground circuit 14 includes an NMOS 141, a diode 142 formed of an NMOS, a diode 143 formed of a PMOS, and a virtual ground wire VGND. The NMOS 141, the diode 142, and the diode 143 are electrically connected with the virtual ground wire VGND. Each of the virtual ground circuits 14 is electrically connected with the source of the fourth NMOS transistor 506 and the source of the third NMOS 505 via the virtual ground wire VGND.

Figure 3:
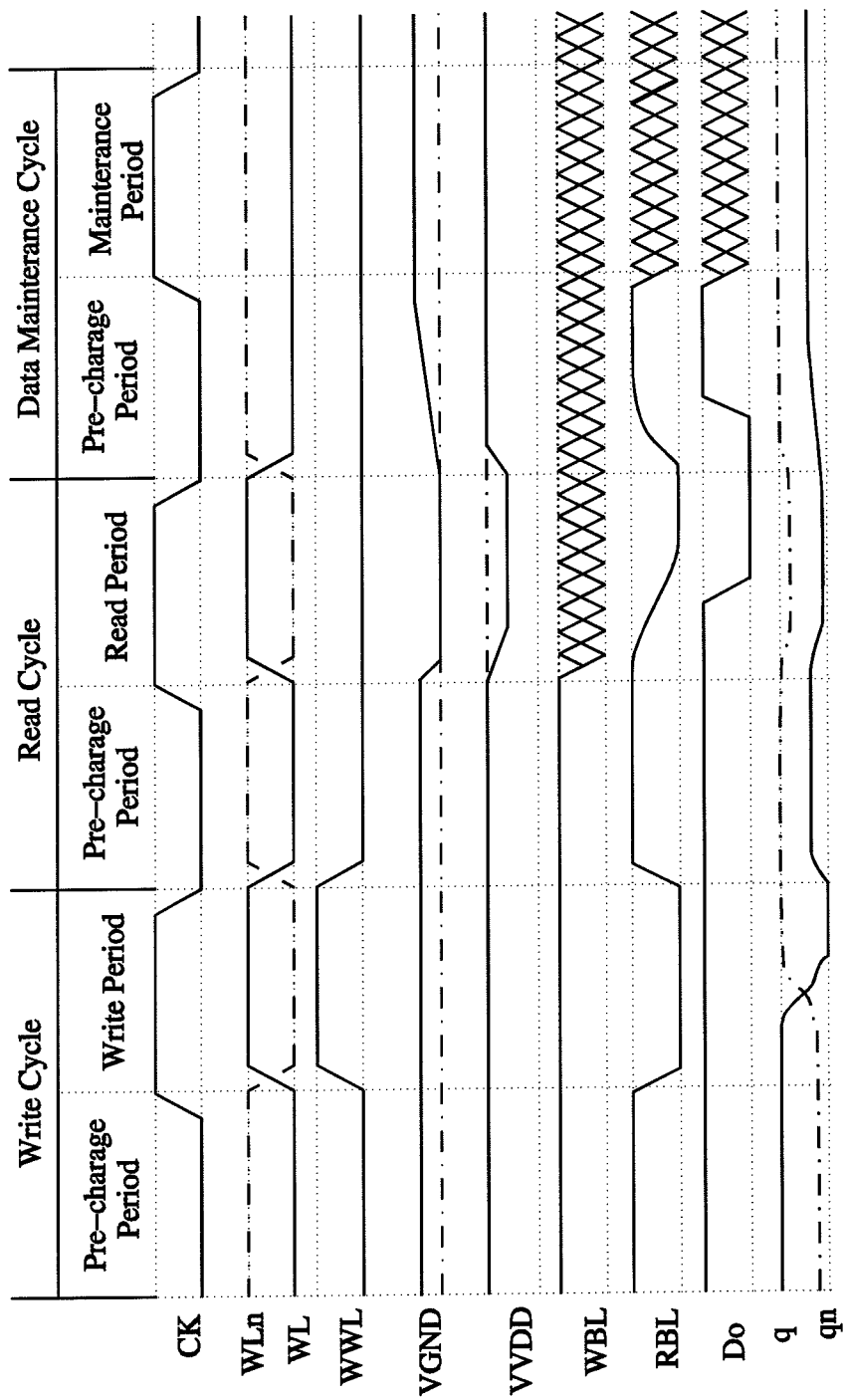
FIG. 3 is a control timing diagram of the preferred embodiment of the present invention.
Figure 4:
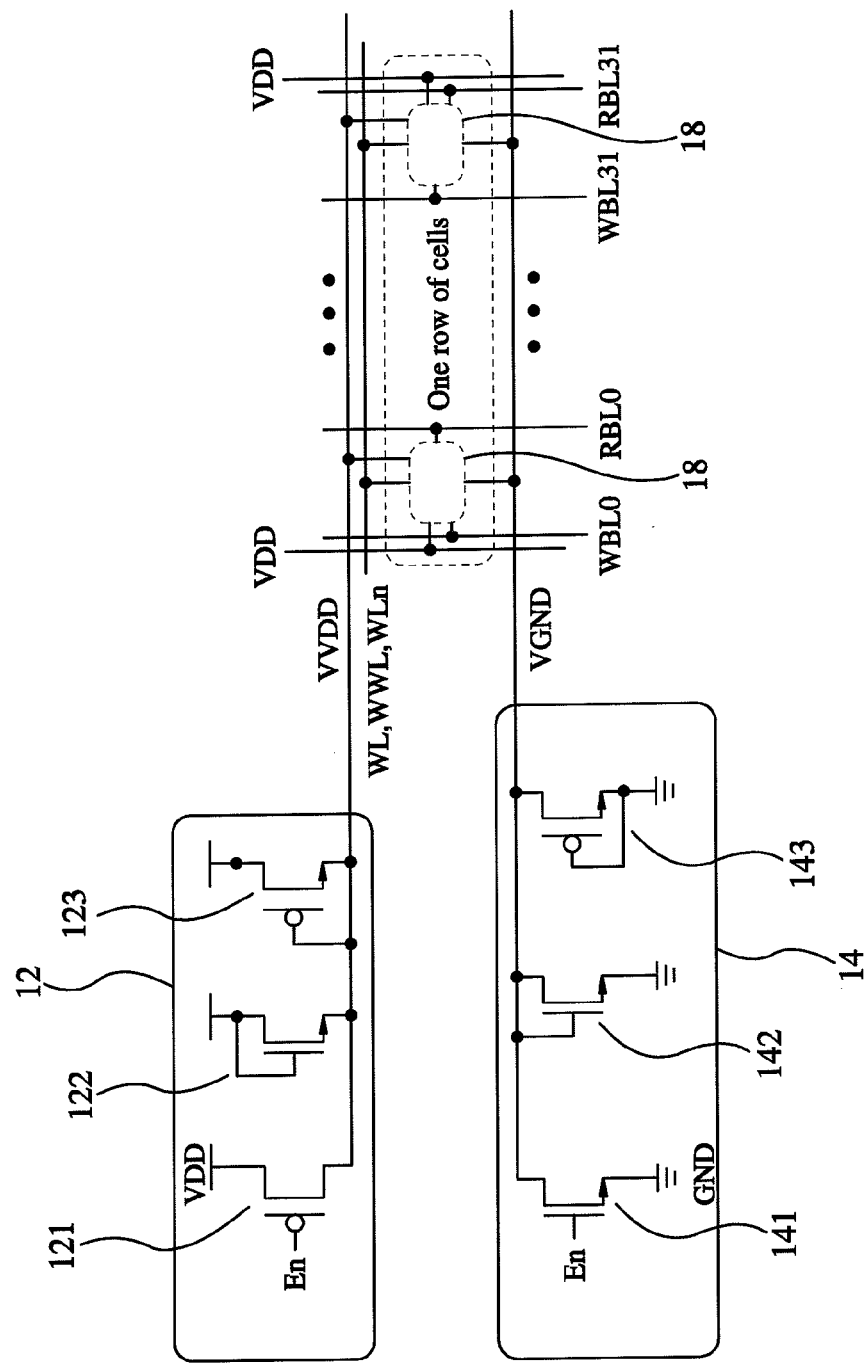
FIG. 4 is a circuit diagram of a part of the first preferred embodiment of the present invention, illustrating the structures of the virtual voltage source circuits and the virtual ground circuits.
Figure 5:
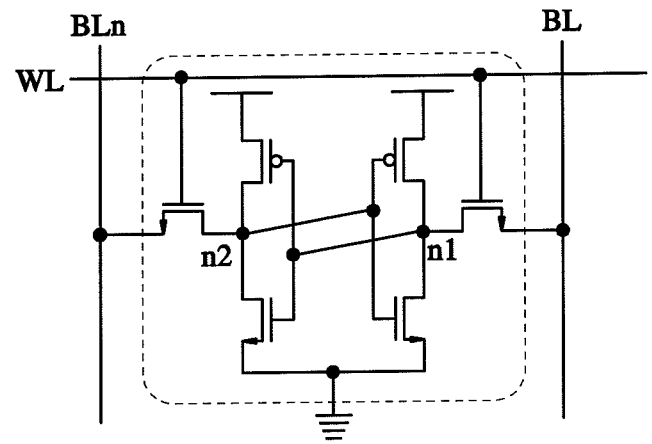
FIG. 5 is a circuit diagram of the conventional RAM cell composed of six transistors.
Figure 6:
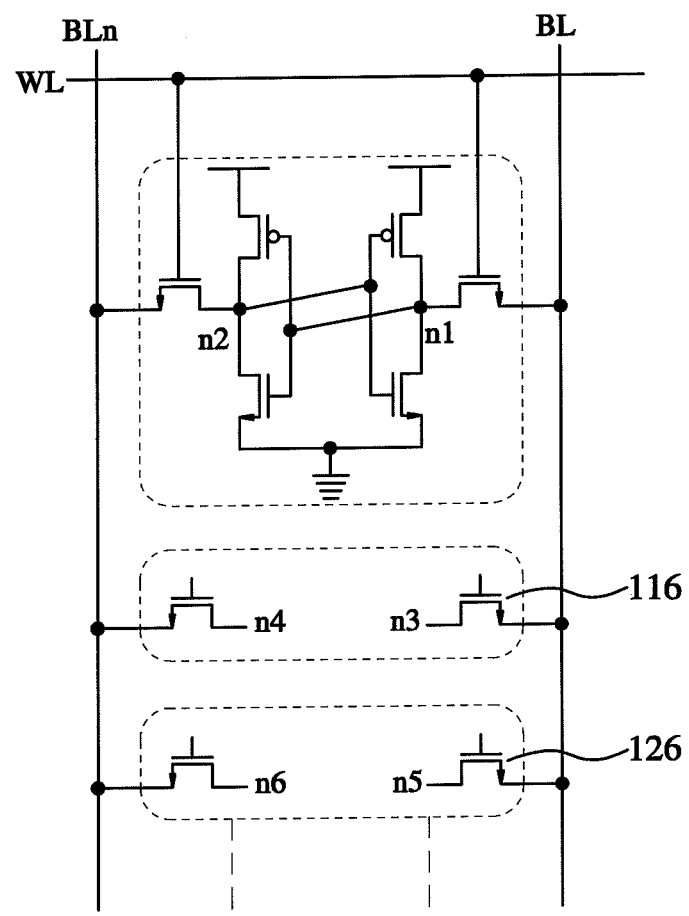
FIG. 6 is a circuit diagram of the conventional RAM cell composed of six transistors and coordinating with bit lines.
Figure 7:
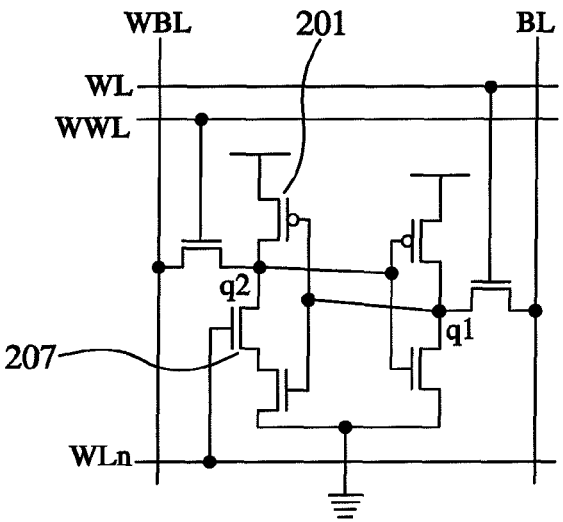
FIG. 7 is a circuit diagram of the conventional RAM cell composed of seven transistors.
Figure 8:
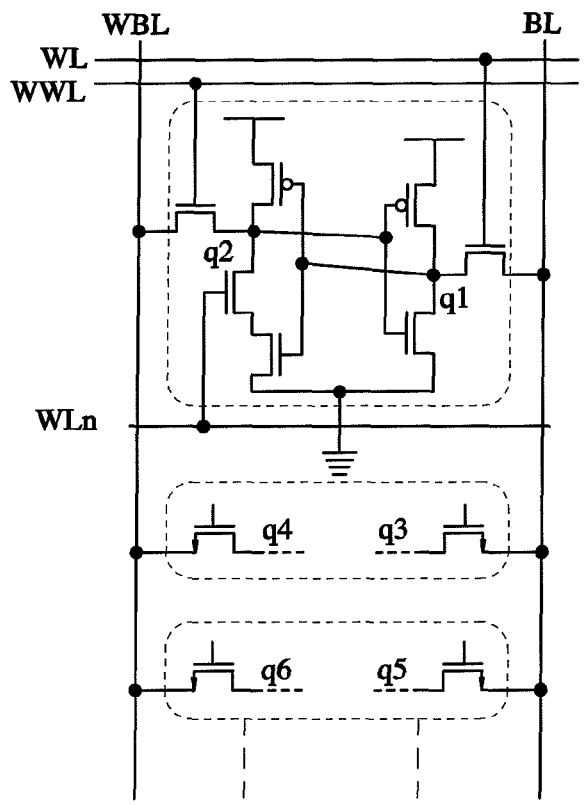
FIG. 8 is a circuit diagram of the conventional RAM cell composed of seven transistors and coordinating with bit lines.
Figure 9:
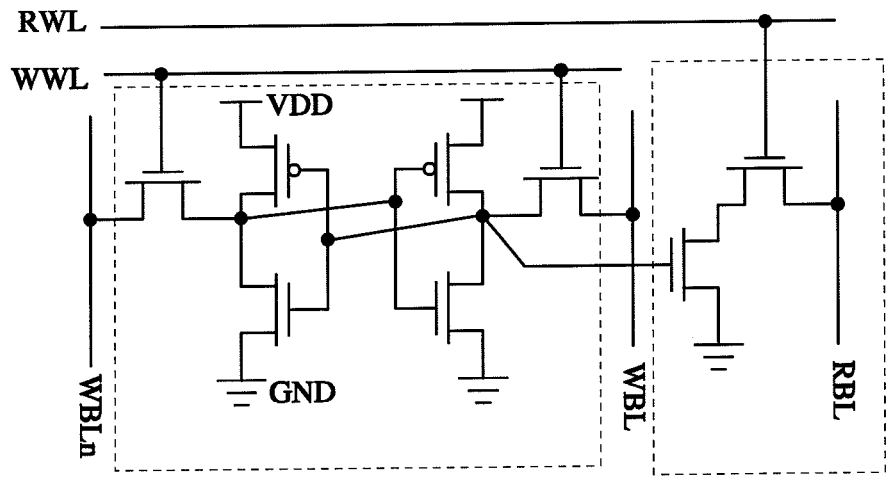
FIG. 9 is a circuit diagram of the conventional RAM cell composed of eight transistors.
Figure 10:
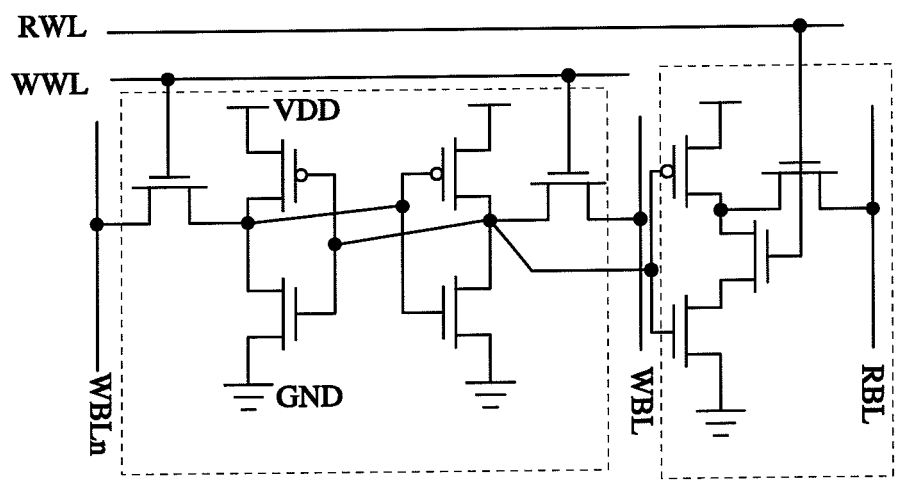
FIG. 10 is a circuit diagram of the conventional RAM cell composed of ten transistors.
Figure 11:
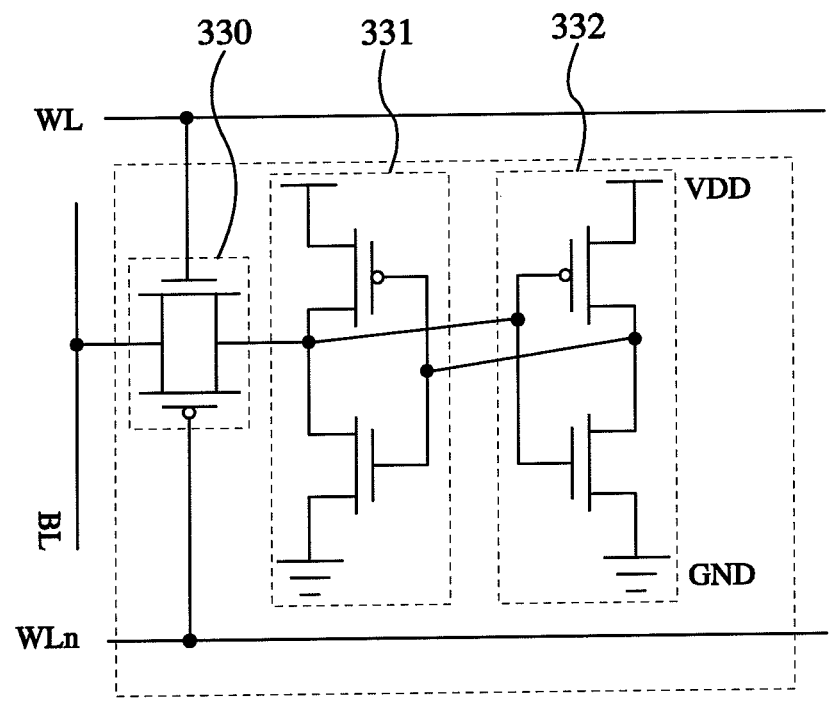
FIG. 11 is a circuit diagram of the conventional S6T memory cell composed of single-end six-transistor.
Figure 12:
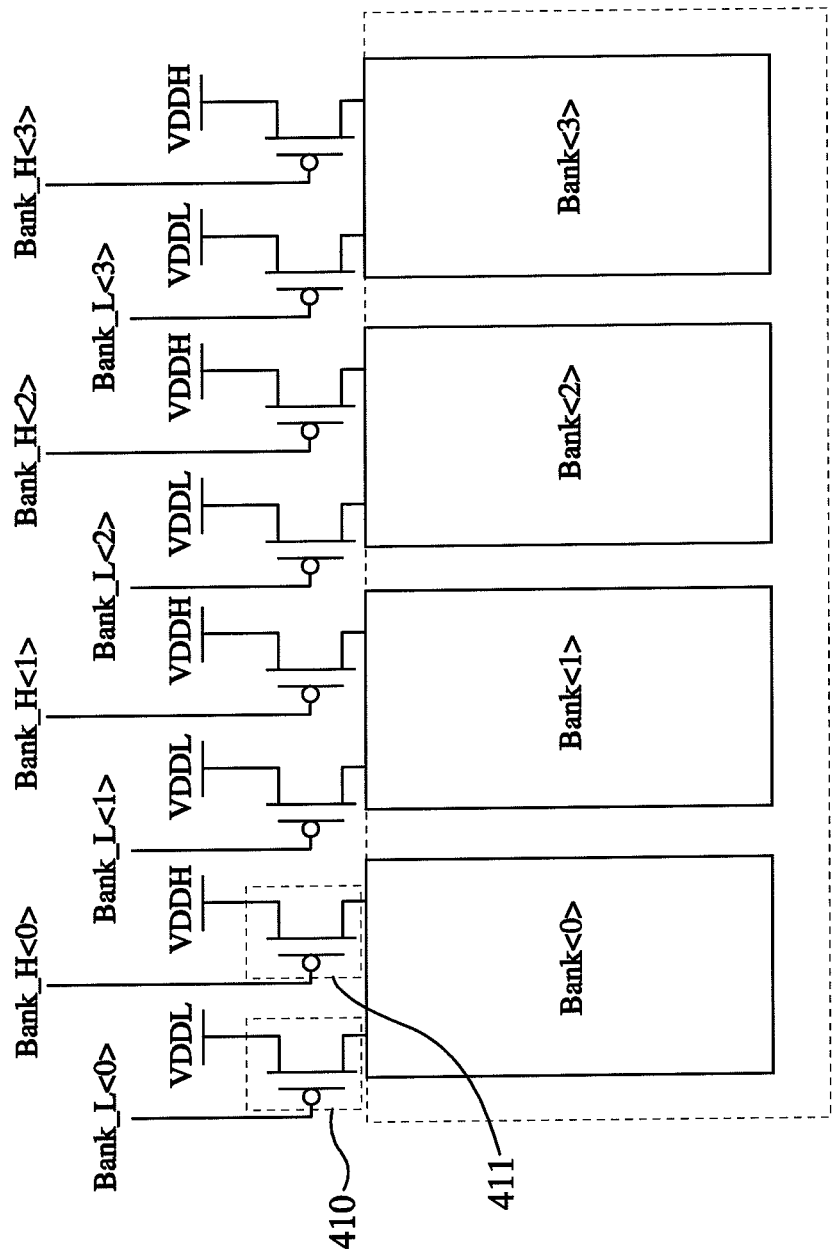
FIG. 12 is a circuit diagram of the conventional RAM cell composed of six transistors and coordinating with power gating.
Figure 13:
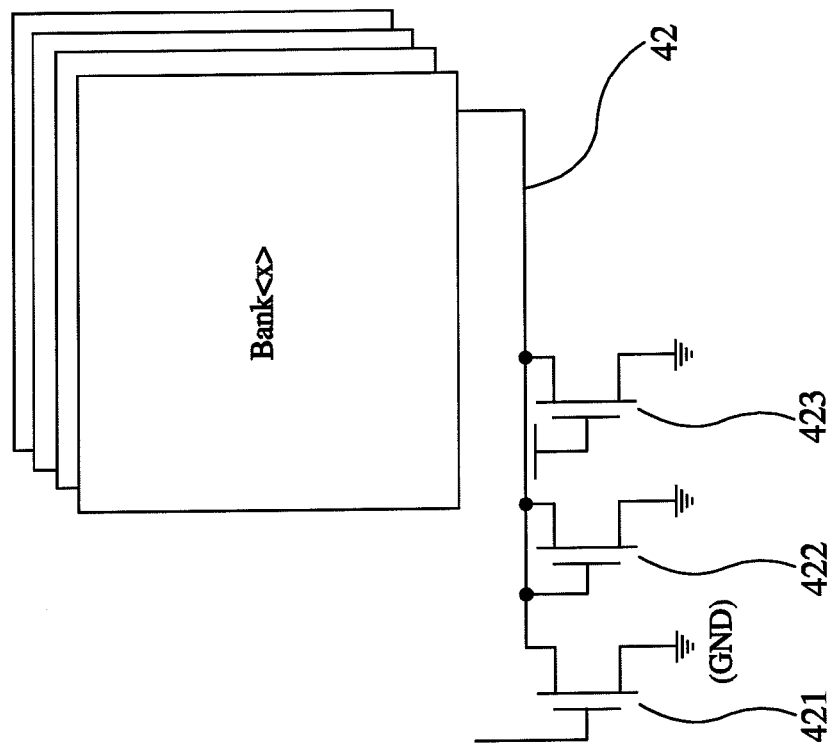
FIG. 13 is a circuit diagram of the conventional RAM cell array composed of six transistors and coordinating with ground gating.
Figure 14:
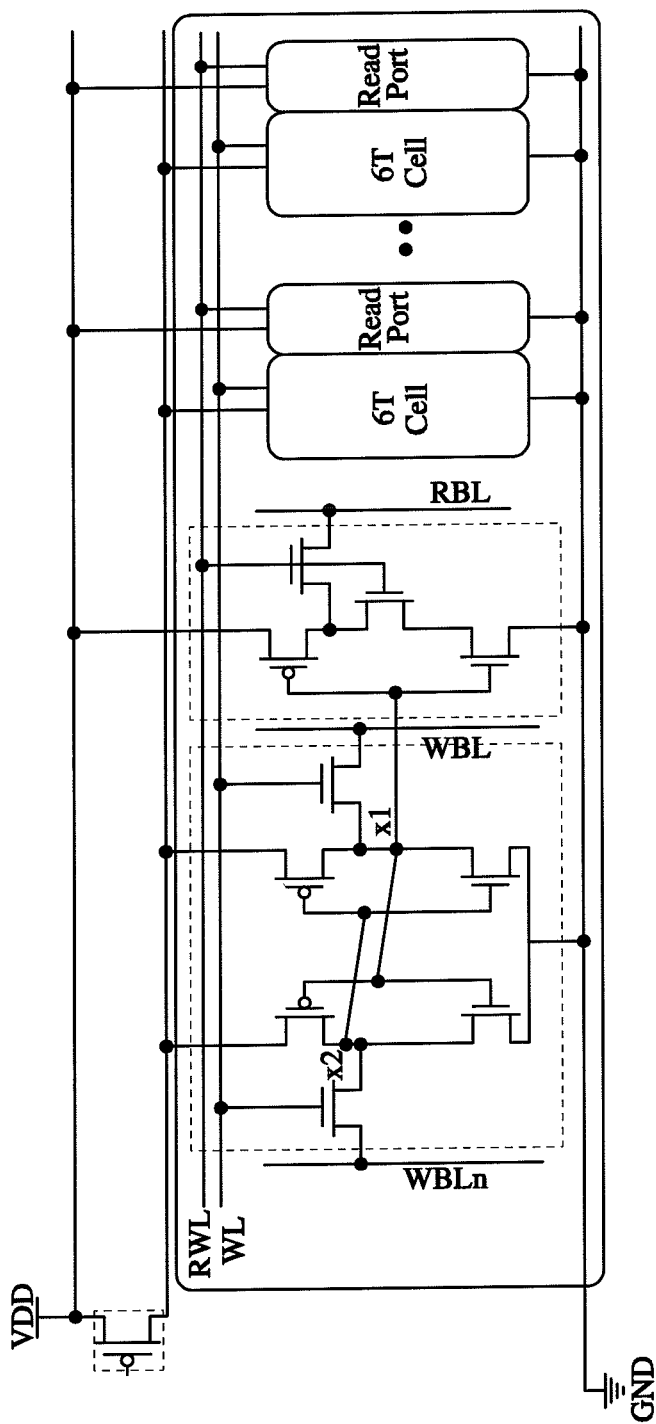
FIG. 14 is a circuit diagram of the conventional RAM cell array composed of ten transistors and coordinating with PMOS power switch.
Figure 15:
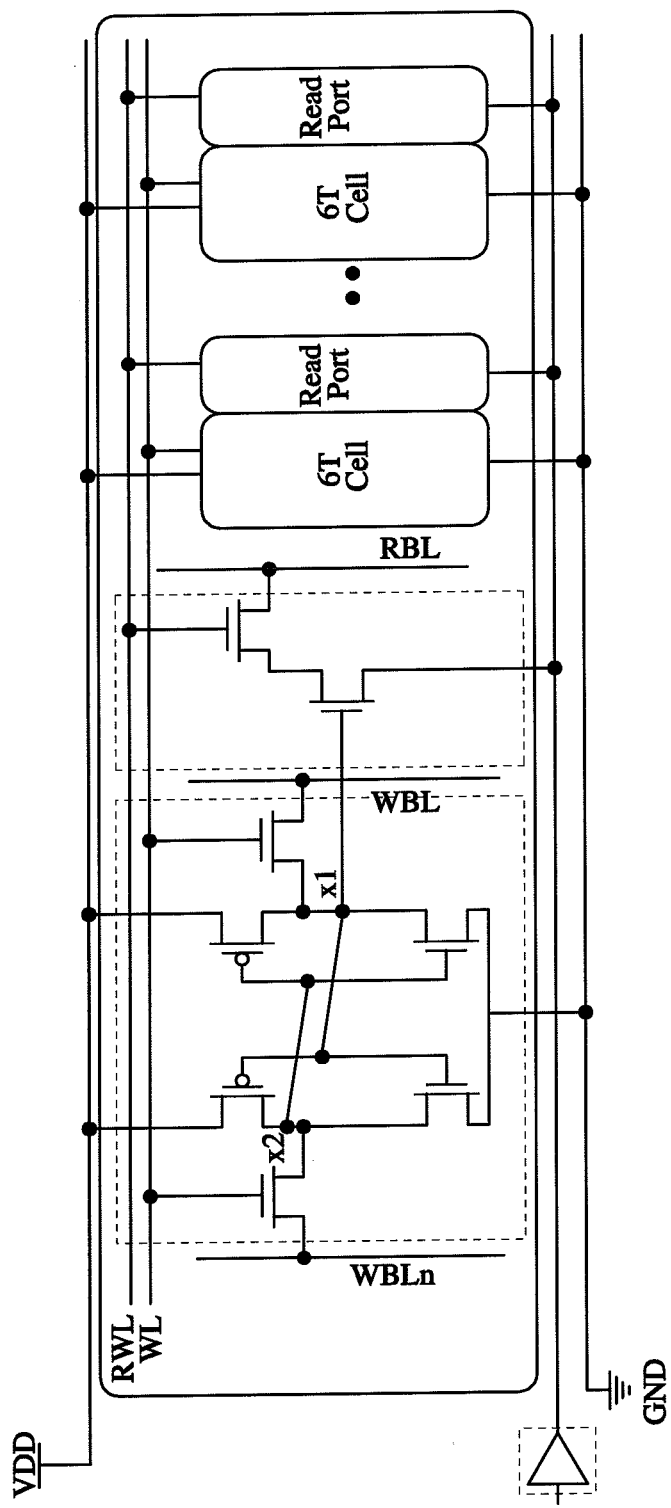
FIG. 15 is a circuit diagram of the conventional RAM cell array composed of eight transistors and coordinating with buffer functioning as ground gating.
Figure 16:
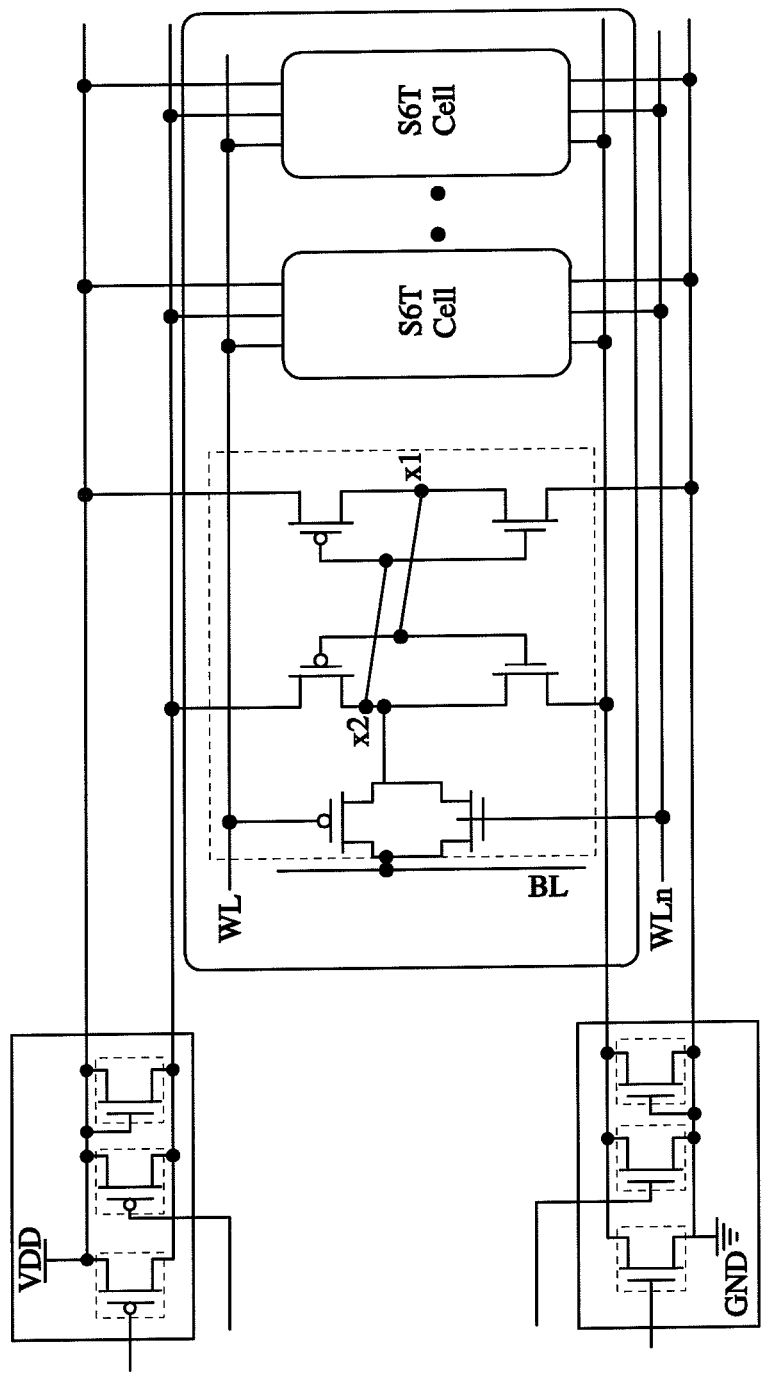
FIG. 16 is a circuit diagram of the conventional S6T memory cell array coordinating with power gating and ground gating.

Next, referring to FIG. 3, the timing control method of this embodiment of the present invention is set forth below.

A. Read Action

One clock cycle of the read action is divided into a pre-charge period and a read period.

The first half cycle of the clock is located at the pre-charge period; meanwhile, the logic of the read/write word line WL and the write word line WWL is 0, the read/write inverted word line WLn is 1, the voltage of the virtual power cord VVDD is equal to the working voltage of the external voltage source VDD, the voltage of the virtual ground wire VGND is higher than the normal ground voltage for one potential difference $\Delta V1$, and the read/ write bit line RBL is charged to the working voltage VDD. The second half cycle of the clock is located at the read period to perform the read action.

At the read period, the operation actions of read row and non-read row are different from each other.

The operation action of the read row includes the following steps: the write word line WWL remains the logic "0", the read/write word line WL is converted from 0 to 1, the read/write inverted word line WLn is converted from 1 to 0, the working voltage VDD of the virtual power cord VVDD is lower for one potential difference $\Delta V2$, and the virtual ground wire VGND is switched to be connected with a solid ground wire (not shown). Taking a node 500 indicated in FIG. 2 as an example (stored logic "0"), the potential of the read/write bit line RBL lowers to read out a low-potential output. Besides, the virtual power cord VVDD lowers for one potential difference $\Delta V2$, taking a node q2 (stored logic "0") in FIG. 1 as an example, to result in stack effect of the first PMOS transistor 501 to lower the leakage current at the node q2 from the first PMOS transistor 501, further puzzling out the problem of the destructive read.

The operation action of the non-read row includes the following steps: the logic of the read/write word line WL and the write word line WWL still keeps 0, the logic of the read/write inverted word line WLn still keeps 1, the working voltage of the virtual power cord VVDD still keeps VDD, and the virtual ground wire VGND still remains higher than the normal ground voltage for one potential difference $\Delta V1$. When working under low working voltage, taking a node 531 (stored logic "0") in FIG. 2 as an example, the voltage of the virtual ground wire VGND of the non-read row rises up to $\Delta V1$ and the leakage current of the read/write bit line RBLx can be lowered by the stack effect to effectively decrease the abnormal potential drop of the read/write bit RBLx, so high-potential output can be read out as expected.

As indicated above, the present invention of this embodiment can be operated under low working voltage and can reliably complete the read action of the high and low potentials of the cells.

B. Write Action

One clock cycle of the write-in action is divided into a pre-charge period and a write period.

The first half cycle of the clock is located at the pre-charge period; meanwhile, the logic of the read/write word line WL and the write word line WWL is 0, the read/write inverted word line WLn is 1, the voltage of the virtual power cord VVDD is equal to the working voltage of the external voltage source VDD, the voltage of the virtual ground wire VGND is higher than the normal ground voltage for one potential difference $\Delta V1$, and the read/write bit line RBL is charged to the working voltage VDD. The second half cycle of the clock is located at the write period to perform the write-in action.

The operation action of the write row includes the following steps: the write word line WWL and the read/write word line WL is converted from 0 to 1, the read/write inverted word line WLn is converted from 1 to 0, the working voltage VDD of the virtual power cord VVDD lowers for one potential difference $\Delta V2$, and the voltage of the virtual ground wire VGND is higher than the normal ground voltage for the potential difference $\Delta V1$. Under lower working voltage, the voltage of the virtual ground wire VGND is $\Delta V1$ higher than the normal ground voltage, so the potential difference between the highest voltage and the lowest voltage of the cell in the read row is smaller than that of the write bit line WBL and the read/write bit line and the inputted signal can easily change the storage value on the node to increase the write reliability and speed.

The operation action of the non-read row includes the following steps: the logic of the read/write word line WL and the write word line WWL still keeps 0, the logic of the read/write inverted word line WLn still keeps 1, the working voltage of the virtual power cord VVDD still keeps VDD, and the virtual ground wire VGND still remains higher than the normal ground voltage for one potential difference $\Delta V1$. The read/write world line EL and the write word line WWL are still low-potential to prevent each of the asymmetrical RAM cells 18 in the non-write row from influence of the write bit line WBL and the read/write bit line RBL to further maintain the accuracy of the storage value inside the cells 18. Besides, the voltage of the virtual ground wire VGND in the non-write row is $\Delta V1$, so the potential difference between the highest voltage and the lowest voltage inside each of the asymmetrical RAM cells 18 can be decreased to save the power consumption resulting from leakage current located inside each of the asymmetrical RAM cells 18 at the state of read.

C. Data Maintenance

The operation action of data maintenance includes the following steps: make the logic of the read/write word line WL and the write word line WWL be 0, the logic of the read/write inverted word line WLn be 1, the working voltage of the virtual power cord VVDD be VDD, the virtual ground wire VGND be higher than the normal ground voltage for one potential difference $\Delta V1$, and do not pre-charge the write bit line WBL and the read/write bit line RBL. Because the voltage of the virtual ground wire VGND has been heightened to $\Delta V1$, the potential difference between the highest voltage and the lowest voltage inside each of the asymmetrical RAM cells 18 can be reduced to save the power consumption resulting from leakage current located inside each of the asymmetrical RAM cells 18. In addition, as the voltage of the virtual ground wire VGND is heightened up to $\Delta V1$, the noise immunocompetence at the state of the data maintenance can though be lowered, but the logic of the read/write word line WL and the write word line WWL is 0. Thus, within the cycle of the data maintenance, the write bit line WBL and the read/write bit line RBL fail to transmit the signal to each of the asymmetrical RAM cells 18. Moreover, the storage value inside each of the asymmetrical RAM cells 18 still remains the state that the two inverters are latched with each other, so the operation action of the data maintenance can be maintained.

In conclusion, the present invention is based on the stack effect to reinforce the write-in and read ability under the low working voltage to make the actions of write and read under the low working voltage more stable. Besides, the leakage current can be lessened to further lower the power consumption. Further, lessening the leakage current and increasing the stability of the read and write-in actions can allow the write bit line WBL and the read/write bit line RBL to coordinate with more memory cells to further save the cost consumption resulting from the area of the memory cell array.

Although the present invention has been described with respect to a specific preferred embodiment thereof, it is in no way limited to the specifics of the illustrated structures but changes and modifications may be made within the scope of the appended claims.

What is claimed is:

1. A memory circuit properly workable under low working voltage, comprising:
   a plurality of write word lines;
   a plurality of write bit lines;
   a plurality of read/write word lines;
   a plurality of read/write bit lines;
   a plurality of read/write inverted word lines;
   a plurality of virtual voltage source circuits;
   a plurality of virtual ground circuits; and
   a plurality of asymmetrical RAM cells constituting a cell array electrically connected with the write word lines, the write bit lines, the read/write word lines, the read/write bit lines, the read/write inverted word lines, the virtual voltage source circuits, and the virtual ground circuits, each of the asymmetrical RAM cells is formed of seven transistors, five of which are NMOS transistors and two of which are PMOS transistors;
   wherein the gate of the first PMOS transistor is electrically connected with the drain of the second PMOS transistor, the drain of the second NMOS transistor, the gate of the third NMOS transistor, and the drain of the fourth NMOS transistor, the source of the first PMOS transistor being electrically connected with the virtual voltage source circuit, the drain of the first PMOS transistor being electrically connected with the gate of the second PMOS transistor, the gate of the fourth NMOS transistor, the drain of the first NMOS transistor, and the drain of the fifth NMOS transistor;
   wherein the source of the second PMOS transistor is electrically connected with an external voltage source;
   wherein the gate of the first NMOS transistor is electrically connected with the write word line and the source of the first NMOS transistor is electrically connected with the write bit line;
   wherein the gate of the second NMOS transistor is electrically connected with the read/write word line and the source of the second NMOS transistor is electrically connected with the read/write bit line;
   wherein the source of the third NMOS transistor is electrically connected with the virtual ground circuit and the drain of the third NMOS transistor is electrically connected with the source of the fifth NMOS transistor;
   wherein the source of the fourth NMOS transistor is electrically connected with the virtual ground circuit;
   wherein the gate of the fifth NMOS transistor is electrically connected with the read/write inverted word line.

2. The memory circuit as defined in claim 1, wherein the virtual ground circuit comprises an NMOS, a diode formed of an NMOS, a diode formed of a PMOS, and a virtual ground wire, the NMOS and the diodes of the NMOS and PMOS being electrically connected with the virtual ground wire; the virtual ground circuit is electrically connected with the source of the fourth NMOS transistor and the source of the third NMOS transistor via the virtual ground wire.

3. The memory circuit as defined in claim 1, wherein the virtual voltage source circuit comprises a PMOS, a diode formed of an NMOS, a diode formed of a PMOS, and a virtual power cord, the PMOS and the diodes of the NMOS and PMOS being electrically connected with the virtual power cord; the virtual voltage source circuit is electrically connected with the gate of the first PMOS transistor via the virtual power cord.

* * * * *